(12) United States Patent
Suzuki et al.

(10) Patent No.: US 7,012,470 B2
(45) Date of Patent: Mar. 14, 2006

(54) COMMUNICATION SEMICONDUCTOR INTEGRATED CIRCUIT WITH FREQUENCY ADJUSTMENT/CONTROL CIRCUIT

(75) Inventors: Jun Suzuki, Takasaki (JP); Hirokazu Miyagawa, Takasaki (JP); Yoshiyuki Ezumi, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/807,158

(22) Filed: Mar. 24, 2004

(65) Prior Publication Data
US 2004/0189403 A1    Sep. 30, 2004

(30) Foreign Application Priority Data
Mar. 25, 2003    (JP)    ............................. 2003-081734

(51) Int. Cl.
*H03L 7/197*    (2006.01)
(52) U.S. Cl. ........................................ 331/16; 332/127
(58) Field of Classification Search ................. 331/16, 331/17; 332/117, 118, 138, 141, 103, 104, 332/126–128; 455/42–45
See application file for complete search history.

(56) References Cited

U.S. PATENT DOCUMENTS

| | | | |
|---|---|---|---|
| 4,313,209 A * | 1/1982 | Drucker | 455/112 |
| 5,180,993 A * | 1/1993 | Dent | 331/16 |
| 5,834,987 A * | 11/1998 | Dent | 332/127 |
| 5,983,077 A * | 11/1999 | Dent | 455/44 |
| 6,515,553 B1 * | 2/2003 | Filiol et al. | 332/127 |
| 6,774,740 B1 * | 8/2004 | Groe | 332/103 |

FOREIGN PATENT DOCUMENTS

JP        7-46123        2/1995

* cited by examiner

*Primary Examiner*—Minh Nguyen
(74) *Attorney, Agent, or Firm*—Mattingly, Stanger, Malur & Brundidge, P.C.

(57) ABSTRACT

The present invention provides a communication semiconductor integrated circuit wherein a first control voltage for a voltage-controlled oscillator circuit is controlled based on a feedback signal sent from a PLL loop to generate a carrier frequency signal used as a carrier, and under the generation of the carrier frequency signal, a second control voltage for the voltage-controlled oscillator circuit is controlled based on the output of a DA converter circuit for DA-converting a code generated based on transmit data to thereby frequency-modulate an oscillation signal. The communication semiconductor integrated circuit is provided with a frequency adjustment/control circuit which measures the frequency of an oscillation output of the voltage-controlled oscillator circuit and adjusts a reference current value of the DA converter circuit according to the difference between the measured value and a target value to thereby correct the frequency.

10 Claims, 8 Drawing Sheets

COMMUNICATION SEMICONDUCTOR INTEGRATED CIRCUIT WITH FREQUENCY ADJUSTMENT/CONTROL CIRCUIT

CROSS-REFERENCE TO RELATED APPLICATION

The present application claims priority from Japanese patent application JP 2003-081734 filed on Mar. 25, 2003, the content of which is hereby incorporated by reference into this application.

BACKGROUND OF THE INVENTION

The present invention relates to a technique for adjusting an oscillation frequency of a voltage-controlled oscillator (VCO), and to, for example, a technique effective for application to a communication semiconductor integrated circuit employed in a transmission system of a wireless communication system, wherein a voltage-controlled oscillator is controlled based on transmit data while generating a carrier frequency signal (carrier) by the voltage-controlled oscillator to thereby frequency-modulate the carrier.

In the standard called "Bluetooth" that sets the rules related to the transmission of data between peripheral devices such as a personal computer, a printer, etc. by wireless communication, a frequency modulation system has heretofore been adopted which modulates a carrier frequency signal lying in a 2.4 GHz band with ±160 kHz and transmits data.

When such frequency modulation is performed, there is considered a system wherein a voltage-controlled oscillator for generating a carrier is controlled based on transmit data to modulate the frequency. As the voltage-controlled oscillator used in the modulation, there are known a circuit of such a type that the current is varied by a control voltage to thereby control an oscillation frequency, and an LC resonant voltage-controlled oscillator wherein the capacitance value of a variable capacitor is varied by a control voltage to thereby control an oscillation frequency.

The above voltage-controlled oscillator used in the wireless communication must be oscillated in a desired frequency range. However, the oscillation frequency of the voltage-controlled oscillator is often shifted from the desired frequency range depending on variations in manufacture. Therefore, it has heretofore been practiced to measure the frequencies of the voltage-controlled oscillator one by one by probe inspection at the final stage of a manufacturing process and adjust the capacitance values of capacitive elements constituting the voltage-controlled oscillator by trimming using laser or the like to thereby match up the frequencies. However, a problem arises in that an adjustment made to the frequencies by trimming in the manufacturing process will increase the manufacturing cost.

Since the capacitive elements formed on a semiconductor chip might vary in capacitance value with a change in the distance between electrodes due to stress applied to a chip, the oscillation frequency of the voltage-controlled oscillator might vary according to the form of packaging of the chip. There is also a fear that the oscillation frequency of the voltage-controlled oscillator will be shifted due to a time variation in device characteristic and a variation in temperature. Thus, the adjustment to the frequencies by trimming in the manufacturing process cannot provide the correction of the oscillation frequency of the voltage-controlled oscillator, which varies according to the form of packaging and is shifted due to a variation in operating environment.

Meanwhile, as the invention related to a PLL circuit capable of automatically adjusting a self-running frequency of the voltage-controlled oscillator, there has been proposed one provided with a comparator which compares a control voltage supplied from a loop filter to the voltage-controlled oscillator and a voltage used as the reference, and a circuit which generates trimming data, based on the result of comparison by the comparator (see, for example, a patent document 1).

Patent Document 1

Japanese Unexamined Patent Publication No. Hei 7(1995)-46123

SUMMARY OF THE INVENTION

The frequency modulation system has a problem in that the amount of displacement of the frequency varies even it is modulated with the same transmit data in addition to a variation in carrier frequency. The invention of the prior application is no more than one wherein a variation in frequency (equivalent to the carrier frequency in the frequency modulation system) in a main loop of the PLL circuit including the voltage-controlled oscillator can be adjusted by the trimming data. Therefore, the modulating voltage-controlled oscillator employed in a transmission system of a wireless communication system in which modulation information is given to the voltage-controlled oscillator has a problem in that it cannot reach up to an adjustment to the variation in the amount of modulation-based frequency displacement.

The present invention has been made to solve the foregoing problems. Therefore, an object of the present invention is to provide a communication semiconductor integrated circuit capable of adjusting an oscillation frequency of a voltage-controlled oscillator (VCO) without performing trimming in a manufacturing process.

Another object of the present invention is to provide a communication semiconductor integrated circuit capable of adjusting a carrier frequency of a modulating VCO and the amount of modulation-based frequency displacement, which is suitable for use in a wireless communication system wherein the voltage-controlled oscillator (VCO) is controlled based on transmit data to frequency-modulate a carrier.

A further object of the present invention is to provide a communication semiconductor integrated circuit capable of adjusting a carrier frequency of a voltage-controlled oscillator (VCO) and the amount of modulation-based frequency displacement in a state in which it has been packaged on a system.

The above, other objects and novel features of the present invention will become apparent from the description of the present Specification and the accompanying drawings.

A summary of a typical one of the inventions disclosed in the present application will be described as follows:

There is provided a communication semiconductor integrated circuit wherein a first control voltage for a voltage-controlled oscillator circuit (VCO) is controlled based on a feedback signal sent from a PLL loop to generate a carrier frequency signal used as a carrier, and under the generation of the carrier frequency signal, a second control voltage for the voltage-controlled oscillator circuit is controlled based on the output of a DA converter circuit for DA-converting a code generated based on transmit data to thereby frequency-modulate a carrier. The communication semiconductor integrated circuit is provided with frequency adjustment means which measures the frequency of an oscillation output of the voltage-controlled oscillator circuit and adjusts a current value of the DA converter circuit by referring to a target value to thereby correct a shift in the amount of modulation-based frequency displacement.

According to the present invention, since the shift in the amount of frequency displacement can be corrected by the frequency adjustment means, the amount of modulation-based frequency displacement of the voltage-controlled oscillator circuit can be adjusted in a state in which the communication semiconductor integrated circuit having the voltage-controlled oscillator circuit has been packaged on a system. It is thus possible to correct a variation in the amount of modulation-based frequency displacement of the voltage-controlled oscillator circuit without trimming in the manufacturing process and correct even a shift in the amount of frequency displacement due to a change in operating environment.

Preferably, the frequency adjustment means is configured so as to be capable of generating a signal corresponding to the difference between a measurement value of the frequency of the voltage-controlled oscillator circuit and a target value and changing the value of each of capacitors constituting the voltage-controlled oscillator circuit in accordance with the signal, thereby adjusting even the carrier frequency of a carrier. Thus, both the carrier frequency of the oscillation output of the voltage-controlled oscillator circuit and the amount of modulation-based frequency displacement can be corrected by the common circuit, and hence a circuit scale can be reduced as compared with the case in which discrete adjustment means are provided.

DETAILED DESCRIPTION OF THE PREFERRED EMBODIMENTS

Preferred embodiments of the present invention will hereinafter be described with reference to the accompanying drawings.

Figure 1:
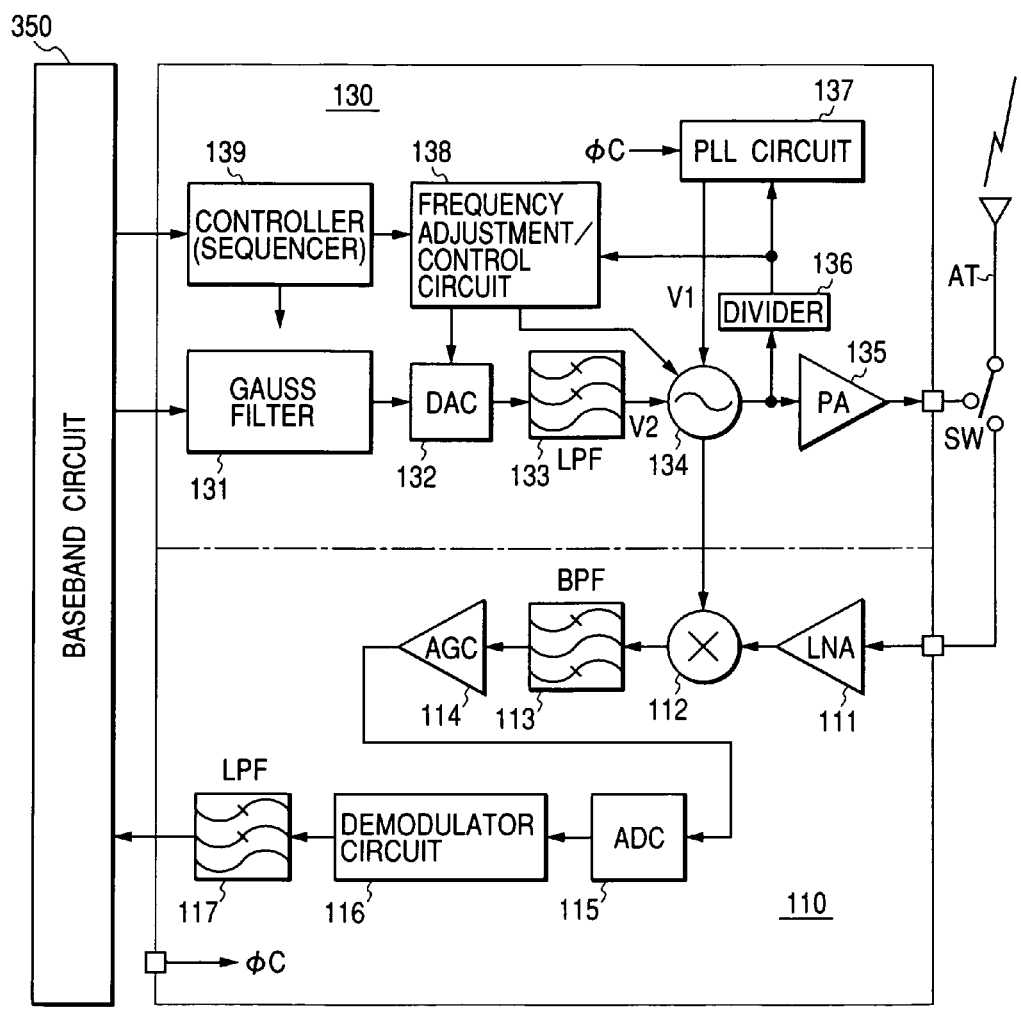
FIG. 1 is a block diagram showing a configurational example of a wireless communication system suitable for application of a communication semiconductor integrated circuit according to the present invention.

A configurational example of a wireless communication system suitable for application of a communication semiconductor integrated circuit according to the present invention is shown in FIG. 1.

In FIG. 1, AT indicates an antenna which transmits and receives a signal wave, SW indicates a transmit-receive changeover switch, reference numeral 110 indicates a reception-system circuit which down-converts a signal received by the antenna AT to an intermediate frequency, demodulates and amplifies the same and converts the so-processed signal to a baseband signal, and reference numeral 130 indicates a transmission-system circuit which generates a carrier frequency signal, modulates the carrier frequency signal in accordance with a baseband signal outputted from a baseband circuit 350 and transmits the modulated signal via the antenna AT. The reception-system circuit 110 and the transmission-system circuit 130 can be configured on one semiconductor chip as a semiconductor integrated circuit.

The transmission-system circuit 130 comprises: a gauss filter 131 which samples a baseband signal (rectangular wave signal on which transmit data is reflected) and thereby generates a code for modulation; a DA converter circuit 132 which DA-converts a digital output supplied from the gauss filter 131 to thereby generate an analog signal having a stepped waveform; a low-pass filter 133 which brings the generated stepped waveform signal into a smooth waveform; a modulating oscillator circuit 134 which comprises a voltage-controlled oscillator (VCO) and performs modulation with an oscillation frequency thereof being controlled in accordance with an output voltage of the low-pass filter 133; and a power amplifier 135 which drives the antenna AT in response to the modulated signal and transmits a signal wave.

Further, the transmission-system circuit 130 employed in the present embodiment comprises: a divider 136 which divides the output of the modulating oscillator circuit 134; and a PLL circuit 137 comprising a phase comparator which compares the phase of the output of the divider 136 and that of a reference clock signal φc and generates a voltage corresponding to the phase difference therebetween to thereby control the oscillation frequency of the VCO circuit 134. The modulating oscillator circuit 134, the divider 136, and the PLL circuit 137 constitute a PLL (Phase-Locked Loop) and generates a carrier frequency signal fc.

The oscillation frequency of the modulating oscillator circuit 134 is varied by a predetermined frequency Δf in accordance with the output voltage V2 of the low-pass filter 133 generated based on the transmit data to thereby modulate the carrier frequency signal fc. A Bluetooth system performs modulation of ±160 kHz on a carrier frequency signal fc lying in a 2.4 GHz band, which is generated on the PLL loop side, from the modulating DA converter circuit 132 side and transmits the so-processed data therefrom.

Also the transmission-system circuit 130 employed in the present embodiment includes: a frequency adjustment/control circuit 138 which detects the oscillation frequency (fc±Δf) of the modulating oscillator circuit 134 on the basis of the signal divided by the divider 136 to thereby perform a frequency adjustment; and a controller 139 comprising a sequencer or the like, which controls the transmission-system circuit 130 and the reception-system circuit 110 in accordance with a command issued from the baseband circuit 350 and operates them according to a predetermined sequence.

The sequencer may include: a register which holds each command supplied from outside; a ROM (Read Only Memory) in which a series of micro instruction groups corresponding to the commands have been stored; and a decoder which decodes the corresponding micro instruction code read from the ROM to thereby generate an internal control signal.

The gauss filter 131 comprises an FIR (Finite Impulse Response) type filter including: a shift register which sequentially fetches input data therein; and a sum-of-products computing unit which multiplies the fetched data by a predetermined filter coefficient and adds them together sequentially.

The reception-system circuit 110 comprises: a low-noise amplifier (LNA) 111 which amplifies the signal received by the antenna AT; a mixer (MIX) 112 which combines the amplified received signal and the oscillation signal sent from the VCO on the transmitting side together to thereby down-convert to a signal having an intermediate frequency (e.g., 2 MHz); a bandpass filter 113 which eliminates a leakage signal produced from an adjacent channel to thereby extract a signal component of the corresponding channel; a gain-variable programmable gain amplifier (AGC) 114 which amplifies the received signal to predetermined amplitude; an AD converter 115 which converts an analog signal to a digital signal; a demodulator circuit 116 which demodulates receive data; and a low-pass filter (LPF) 117 which eliminates a high-frequency component (noise) from the demodulated signal and passes the receive data to the baseband circuit 350.

Figure 2:
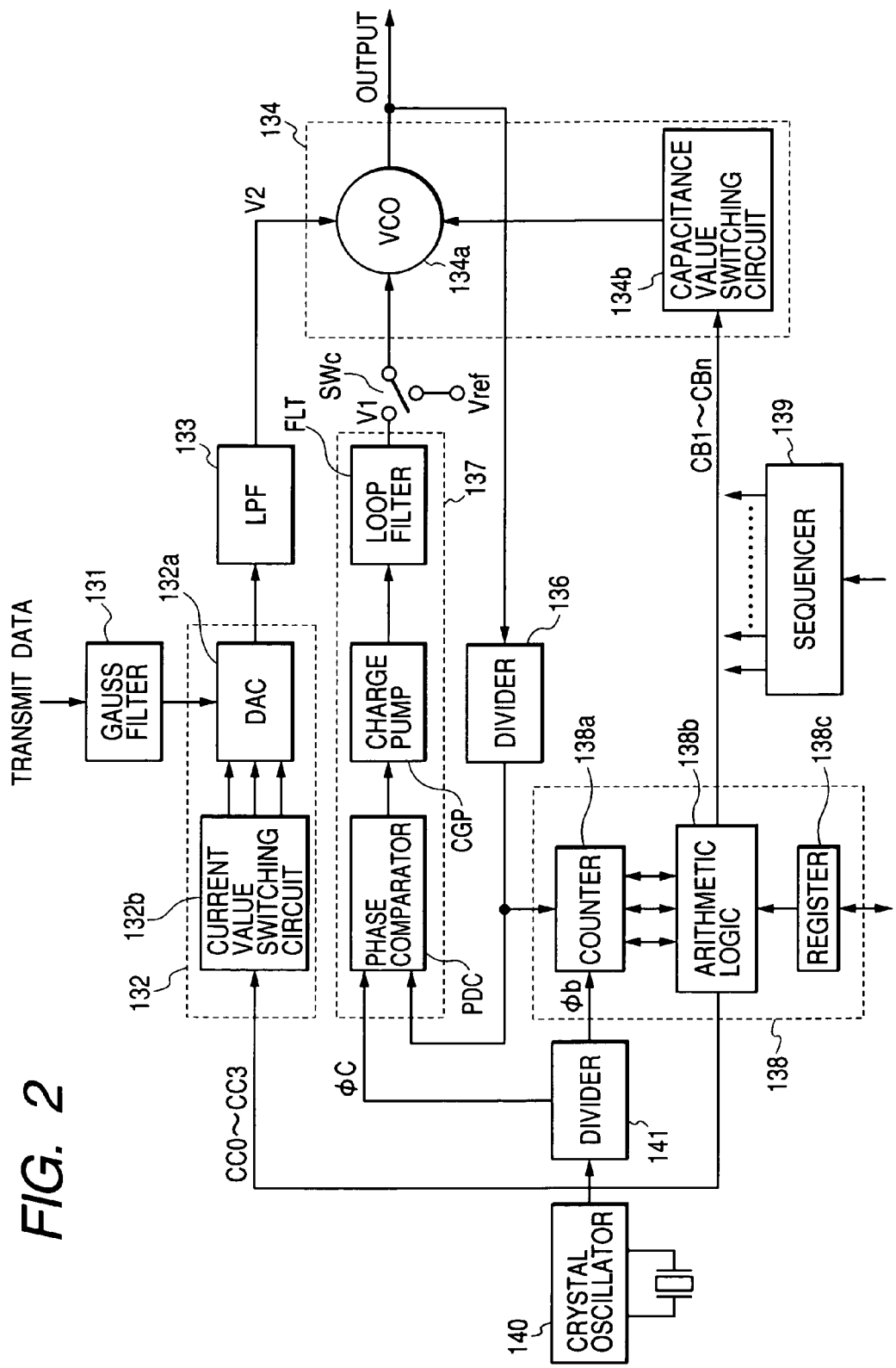
FIG. 2 is a block diagram illustrating one embodiment of a transmission system circuit of the communication semiconductor integrated circuit according to the present invention.

A schematic configurational example of a circuit for adjusting the frequency of the modulating oscillator circuit 134 that constitutes the transmission-system circuit 130, is shown in FIG. 2. In FIG. 2, the same circuit blocks as those shown in FIG. 1 are respectively identified by the same reference numerals and the description of certain common ones will therefore be omitted.

As shown in FIG. 2, the modulating oscillator circuit 134 comprises a VCO 134a comprising an LC resonant oscillator or the like, and a capacitance value switching circuit 134b which varies its capacitance value to thereby adjust the oscillation frequency (carrier frequency fc). The DA converter circuit 132 comprises a DA converter 132a which converts a digital signal to an analog signal, and a current value switching circuit 132b which varies a reference current value of the DA converter 132a to adjust an output analog value and thereby varies the capacitance value of a variable capacitive element provided within the VCO 134a to thereby adjust the amount of modulation-based frequency displacement Δf.

The frequency adjustment/control circuit 138 comprises: a counter 138a which counts the number of pulses of a signal divided by the divider 136 for dividing the oscillation output of the modulating oscillator circuit 134 by a predetermined time interval on the basis of a clock signal φb used as the reference; an arithmetic logic 138b which compares the counted value of the counter 138a with a predetermined set value and generates signals CB1 through CBn and CC0 through CC3 for changing the capacitance value of the capacitance value switching circuit 134b and the current value of the current value switching circuit 132b in accordance with the amount of its displacement; and a register 138c capable of externally setting the set value compared with the counted value of the counter 138a.

Figure 3A:
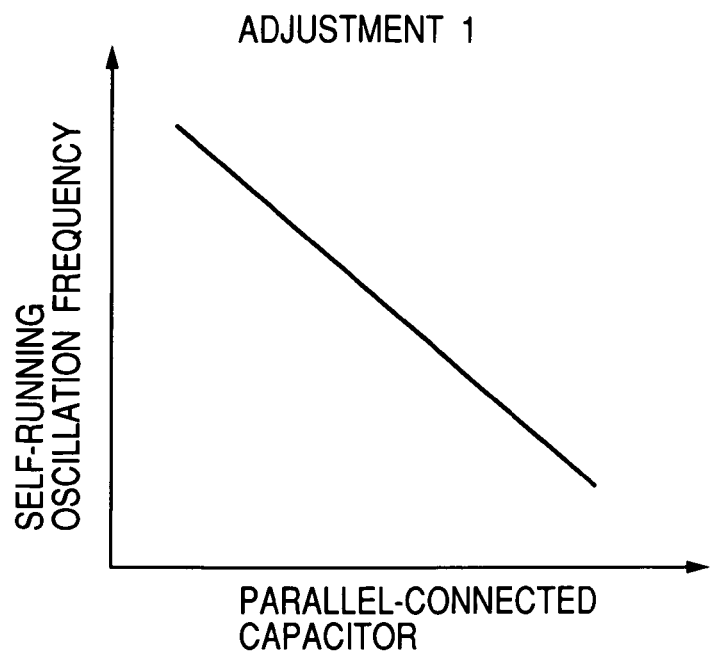
FIG. 3(a) is a graph depicting the relationship between a capacitor connected to a VCO employed in the transmission system circuit of the embodiment and the frequency of the VCO.
Figure 3B:
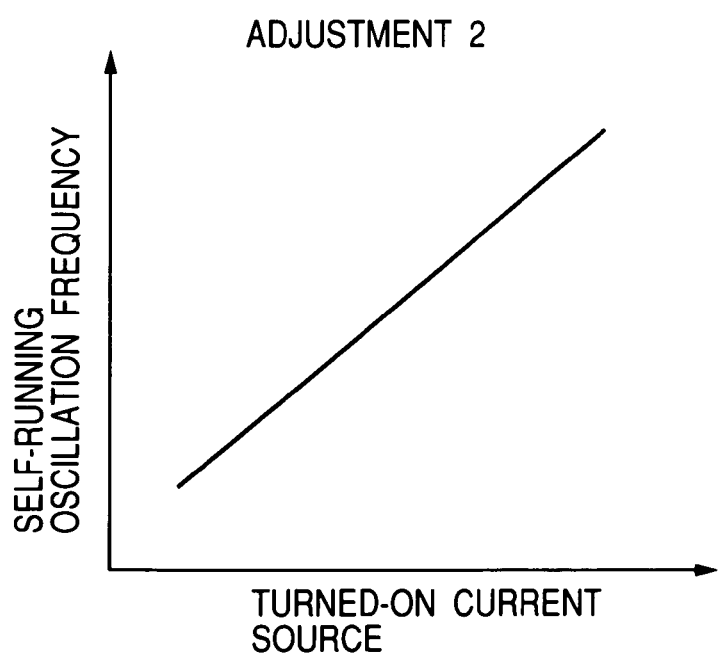
FIG. 3(b) is a graph showing the relationship between a turned-on current source of a DA converter circuit employed in the transmission system circuit of the embodiment and the frequency of the VCO.

Described specifically, when the frequency adjustment/control circuit 138 increases the capacitance value of the capacitance value switching circuit 134b, the self-running oscillation frequency of the VCO 134a decreases, whereas when the frequency adjustment/control circuit 138 decreases the capacitance value of the capacitance value switching circuit 134b, the self-running oscillation frequency of the VCO 134a increases, as shown in FIG. 3(a). On the other hand, when the frequency adjustment/control circuit 138 increases the current value of the current value switching circuit 132b, the self-running oscillation frequency of the VCO 134a increases, whereas when the frequency adjustment/control circuit 138 decreases the current value thereof, the self-running oscillation frequency of the VCO 134a decreases, as shown in FIG. 3(b).

The PLL circuit 137 comprises a phase comparator or detector PDC which compares the phase of the signal divided by the divider 136 for dividing the oscillation output of the VCO 134a and that of the reference clock signal φc and thereby generates control signals UP and DOWN corresponding to the difference in phase therebetween, a charge pump CGP which performs a charge-up operation or a charge-down operation in accordance with the output signal of the phase comparator PDC, and a loop filter FLT that comprises a capacitive element or the like charged and discharged by the current supplied from the charge pump CGP. A voltage V1 corresponding to the phase difference detected by the phase comparator PDC is fed back to the VCO 134a to control the oscillation frequency of the VCO 134a. An oscillation signal generated under the action of the PLL loop is set as the carrier frequency signal fc.

Incidentally, the present embodiment includes even a crystal oscillator 140 which generates a clock signal φ0 high in frequency accuracy, which is set as the base of the reference clock signal φc supplied to the phase comparator PDC, a divider 141 which divides the oscillation signal φ0 to thereby generate the reference clock signal φc and a clock signal φb supplied to the counter 138a, etc.

A selector switch SWc for cutting off the PLL loop and applying a reference voltage Vref to the VCO 134a as an alternative to the control voltage V1 supplied from the loop filter FLT is provided between the loop filter FLT and the modulating VCO 134a. The sequencer 139 switches the selector switch SWc to the selection side of the reference voltage Vref in response to a control signal upon frequency control to thereby allow the VCO 134a to oscillate at a desired frequency. When the VCO 134a does not oscillate at the desired frequency where a reference voltage Vref of a predetermined level is applied to the VCO 134a to cause the VCO 134a to oscillate, it can be judged that the frequency is shifted. The reference voltage Vref may be supplied from outside but generated inside.

Further, in the Bluetooth system, the counter 138a is provided between the divider 136 and the phase comparator 137 as a variable divider, and a register is provided in association with it. Then, the baseband circuit 350 may be configured so as to set a count value to be counted by the counter 138a to the register. Thus, it is possible to shift the carrier frequency in units like 1 MHz, for example, and apply frequency-hopping processing to any of a few ten channels set every 1 MHz between 2.402 GHz and 2.480 GHz. Although the signal obtained by dividing the oscillation output of the modulating oscillator circuit 134 by the divider 136 is counted by the counter 138a, the oscillation output of the modulating oscillator circuit 134 may be directly counted by the counter 138a.

Figure 4:
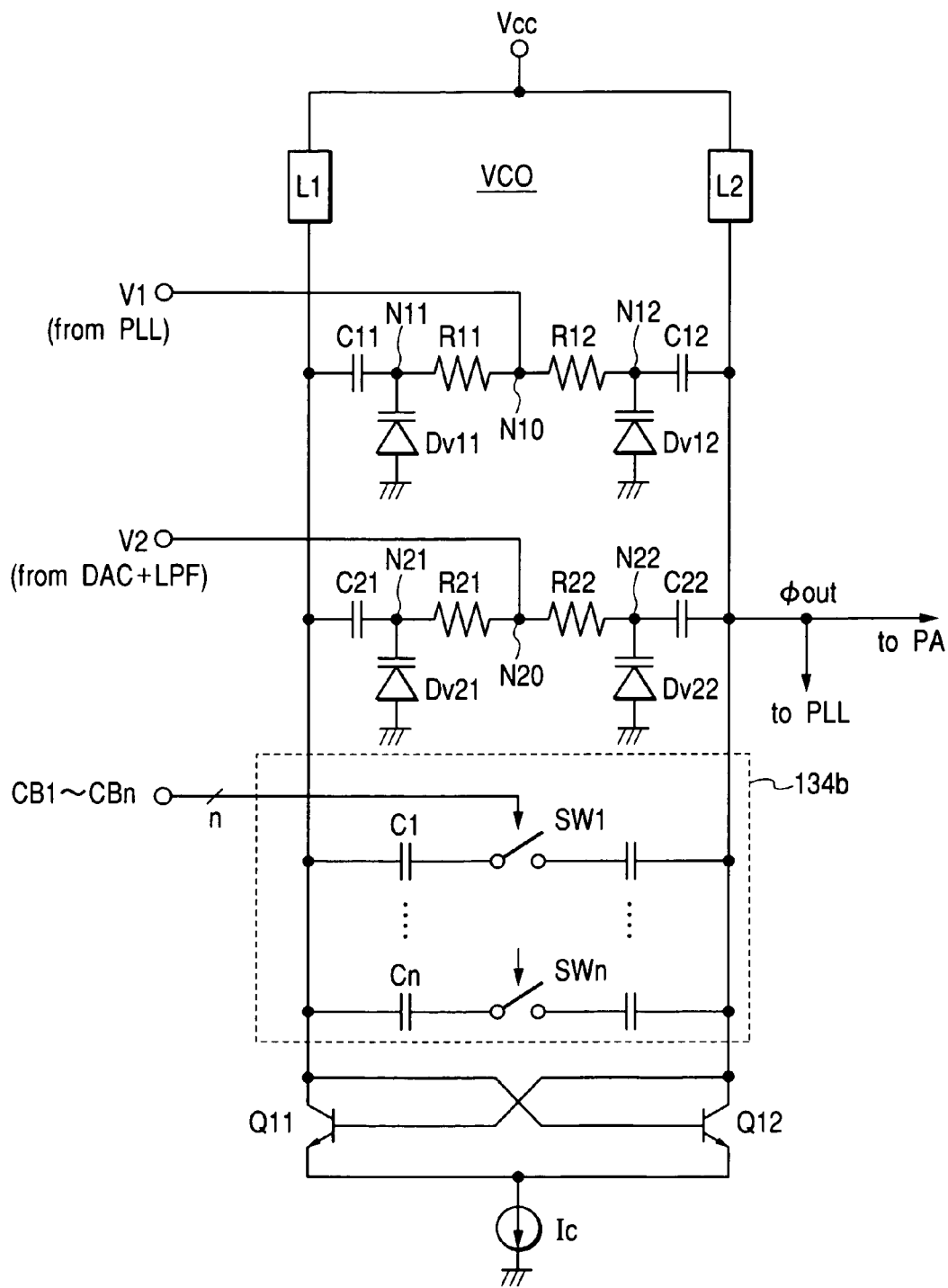
FIG. 4 is a circuit diagram illustrating one embodiment of an LC resonant VCO employed in the communication semiconductor integrated circuit according to the present invention.

FIG. 4 shows one embodiment of the LC resonant oscillator used as the VCO 134a that constitutes the modulating oscillator circuit 134.

The oscillator according to the present embodiment is an LC resonant oscillator which includes inductance elements (L) and capacitive elements (C) and determines an oscillation frequency, based on LC values. As shown in FIG. 4, the present oscillator comprises: a pair of PNP bipolar transistors Q11 and Q12 of which the emitters are connected in common and the bases and collectors are cross-connected; a constant current source Ic connected between the common emitters of the transistors Q11 and Q12 and a ground point; inductors L1 and L2 respectively connected between the collectors of the transistors Q11 and Q12 and a source voltage terminal Vcc; a capacitor C11, resistors R11 and R12 and a capacitor C12 series-connected between the collector terminals of the transistors Q11 and Q12, and a capacitor C21, resistors R21 and R22 and a capacitor C22 connected in parallel with these; varactor diodes Dv11, Dv12, Dv21 and Dv22 used as variable capacitive elements connected between connecting nodes N11, N12, N21 and N22 and the ground point; and a capacitance value switching circuit 134b connected between the collector terminals of the transistors Q11 and Q12.

The constant current sources Ic1 and Ic2 are respectively identical in current value. The inductors L1 and L2, the capacitors C1 and C12, and C21 and C22, the resistors R1 and R2, and the diodes Dv1 and Dv2 are also identical in value respectively.

In the VCO 134a according to the present embodiment, the capacitance values of the varactor diodes Dv11 and Dv12 or Dv21 and Dv22 are varied according to an oscillation control voltage V1 applied to a connecting node N10 of the resistors R11 and R12 or an oscillation control voltage V2 applied to a connecting node N20 of the resistors R21 and R22 so that the oscillation frequency is varied.

When the present embodiment is used as the modulating VCO 134a, the control voltage V1 supplied from the PLL loop is applied to the connecting node N10 to determine a carrier frequency. The frequency modulating control voltage V2 supplied from the low-pass filter 133 shown in FIG. 2 is applied to the connecting node N20, so that the present circuit is connected such that the amount of frequency displacement based on modulation is controlled. An oscillation output φout of the VCO can be fetched from any one of connecting nodes between the collectors of the transistors Q11 and Q12 and the inductances L1 and L2. However, the oscillation output of the VCO can also be taken out from both connecting nodes as a differential output.

The capacitance value switching circuit 134b is configured in such a manner that n pairs of capacitors and switches connected in series are connected in parallel between the collectors of the transistors Q11 and Q12, and the substantial values of capacitances connected between the collectors of the transistors Q11 and Q12 can be switched according to on/off states of the switches SW1, . . . SWn. The capacitance values of the capacitors C1, . . . Cn are respectively set so as to have weights of $2^m$ (where m: positive integers like 0, 1 and 2).

Figure 5:
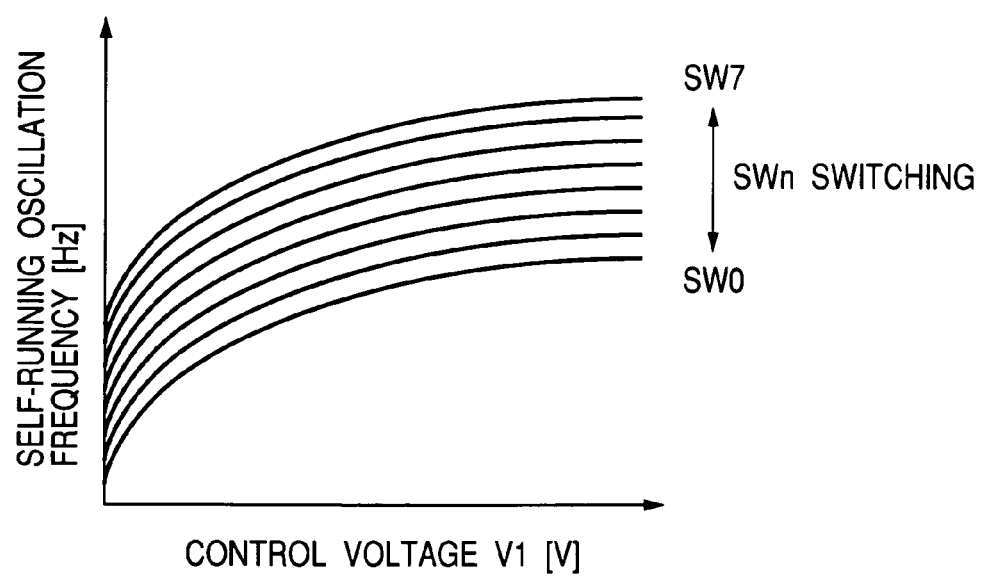
FIG. 5 is a graph showing the relationship between a control voltage (V1) inputted to the LC resonant VCO employed in the transmission system circuit of the embodiment and the oscillation frequency of the VCO.

The capacitance values are varied according to the combinations of on/off control signals CB1 through CBn of the switches SW1 through SWn, whereby the frequency is changed stepwise as shown in FIG. 5. Incidentally, FIG. 5 shows the relationship between the control voltages (V1 and V2) of VCO and its self-running oscillation frequency where n=3, i.e., three sets of capacitors and switches are provided.

Next, the configurations of the current value switching circuit 132b and DA converter 132a, which are used to switch reference currents supplied to the DA converter circuit 132 in order to adjust the amount of modulation-based frequency displacement in the VCO 134a will be explained.

Figure 7:
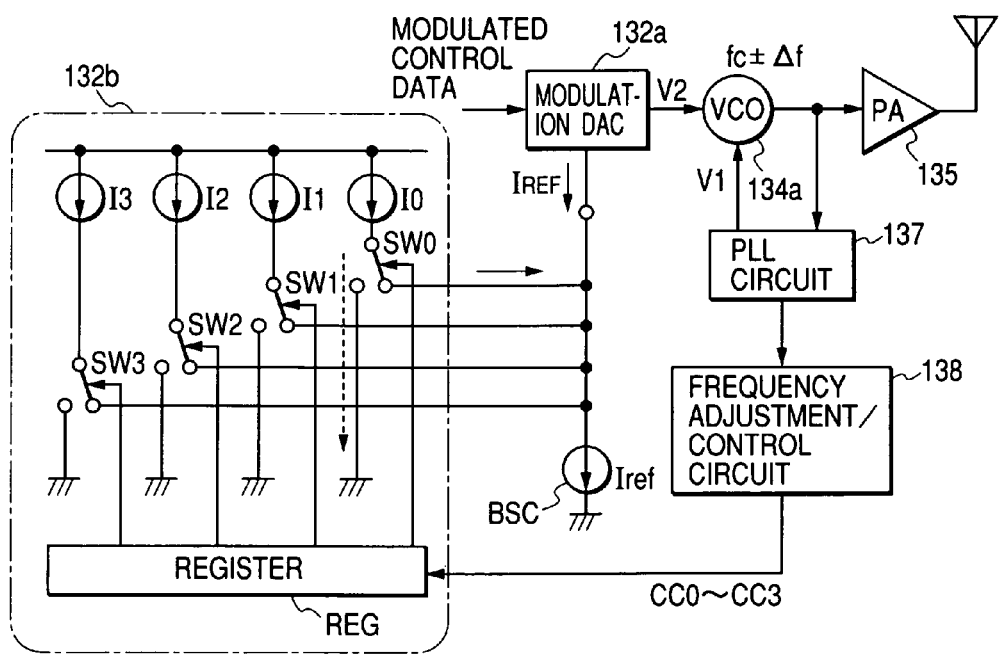
FIG. 7 is a circuit diagram depicting a specific example of a current value switching circuit of the DA converter circuit employed in the transmission system circuit of the embodiment.

A specific circuit example of the current value switching circuit 132b is shown in FIG. 7. Incidentally, the low-pass filter 133 provided between the modulating DA converter 132a and VCO 134a is omitted for convenience of illustration.

The current value switching circuit 132b comprises: weighting current sources I0 through I3 having weights of $2^m$ (where m: positive integers like 0, 1, 2, and 3); selector switches SW0 through SW3 series-connected to these weighting current sources I0 through I3; and a register REG that holds control information about these switches SW0 through SW3. The register REG retains adjustment control signals CC0 through CC3 outputted from the arithmetic logic 138b of the frequency adjustment/control circuit 138 and sets on/off states of the switches SW0 through SW3 in accordance with their retention information.

One terminals of the switches SW0 through SW3 are connected to their corresponding ground points, whereas the other terminals thereof are respectively connected to a reference current source BSC for generating a reference current Iref of the DA converter 132a. When the switch is changed to the reference current source BSC side, the current of the current source corresponding to the switch, of the weighting current sources I0 through I3 is caused to flow into the reference current source BSC so that a reference current IREF supplied to the DA converter 132a is reduced.

Figure 6:
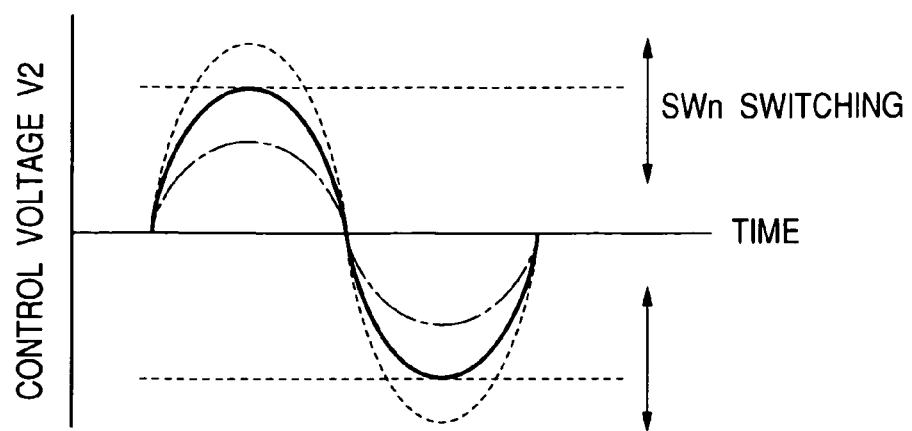
FIG. 6 is an explanatory view illustrating the relationship between the switching of the current source of the DA converter circuit employed in the transmission system circuit of the embodiment and a VCO control voltage (V2) produced therefrom.

When the reference current IREF caused to flow to the DA converter 132a is switched according to the states of the switches SW0 through SW3, the output level of the DA converter 132a with respect to the same input is changed so that the amplitude of the control voltage V2 of the VCO 134a is varied as shown in FIG. 6. Thus, the amount of frequency displacement based on the modulation of the VCO 134a is changed.

Incidentally, the reference current source BSC for generating the reference current Iref can comprise a constant voltage circuit like a bandgap reference circuit and a transistor which receives, at its base, a constant voltage generated by the constant voltage circuit.

Figure 8:
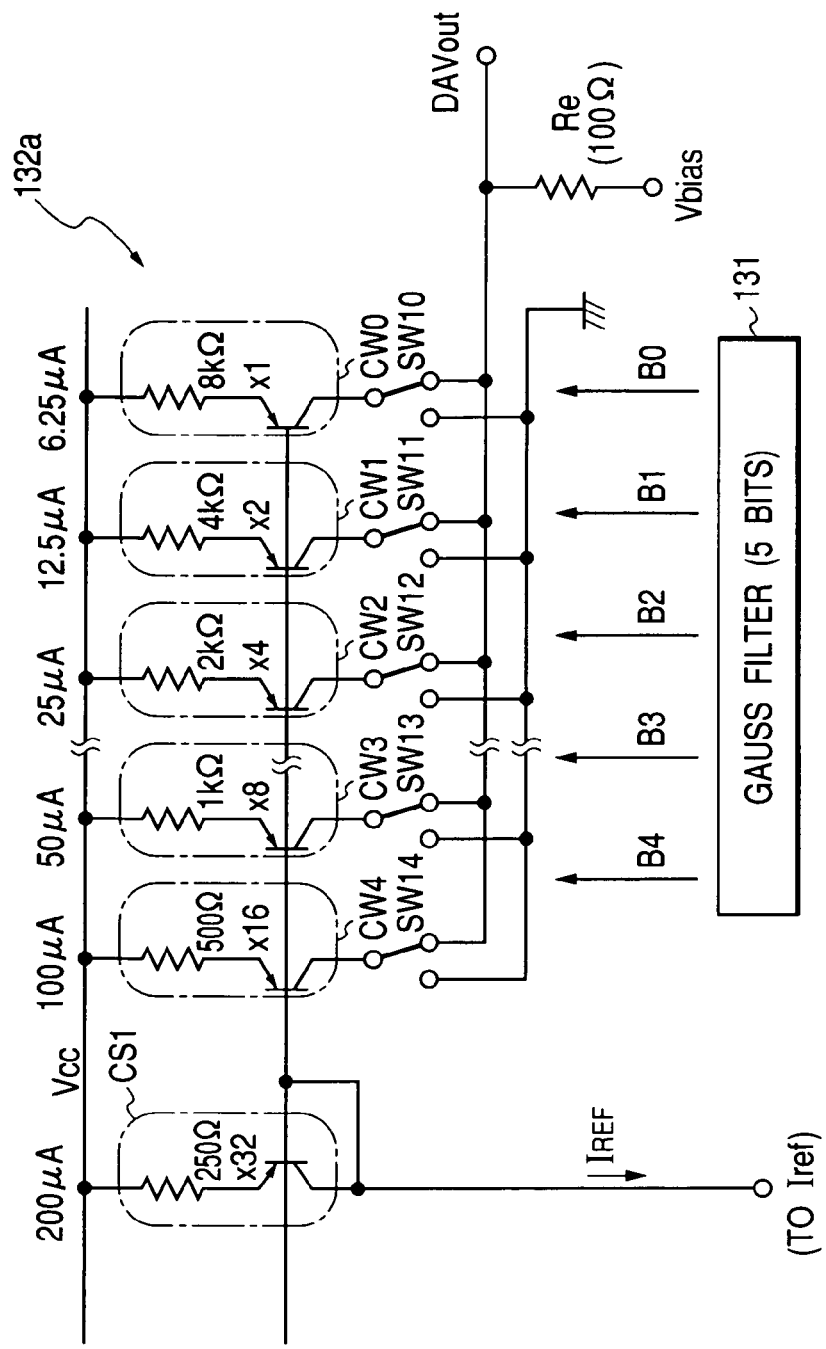
FIG. 8 is a circuit diagram showing a specific example of the DA converter circuit employed in the transmission system circuit of the embodiment.

A specific circuit example of the DA converter 132a is shown in FIG. 8. The DA converter according to the present example comprises: a current source CS1 pulled by a current IREF obtained by adjusting the reference current Iref supplied from the reference current source BSC by the current value switching circuit 132b having such a configuration as shown in FIG. 7; weighting current sources Cw0 through Cw4 which are current-mirror connected to the current source CS1 and cause currents equivalent to $\frac{1}{32}$, $\frac{1}{16}$, $\frac{1}{8}$, $\frac{1}{4}$ and $\frac{1}{2}$ of the reference current IREF to flow respectively; selector switches SW10 through SW14 connected in series with these weighting current sources Cw0 through Cw4; and a current-voltage converting resistor Re connected to common connecting terminals of these switches SW10 through SW14.

The other terminals of the switches SW10 through SW14 are respectively connected to a ground point. The currents of the weighting current sources Cw0 through Cw4 are supplied to either the current-voltage converting resistor Re or the ground point by the switches SW10 through SW14. One having a resistance value like 100 Ω is used as the resistor Re. A predetermined bias voltage Vbias is applied to the other end of the resistor Re.

In the DA converter 132a, the switches SW10 through SW14 are respectively changed over and controlled in accordance with outputs B4 through B4 of the gauss filter 131 so that a current obtained by combining the currents flowing through the switches changed over to the resistor side is caused to flow into the resistor Re. Then the current is converted into its corresponding voltage by the resistor Re, whereby any voltage DAVout of $2^5$, i.e., 32 steps is outputted from the DA converter 132a in accordance with the outputs B4 through B0 of the gauss filter 131.

Figure 9:
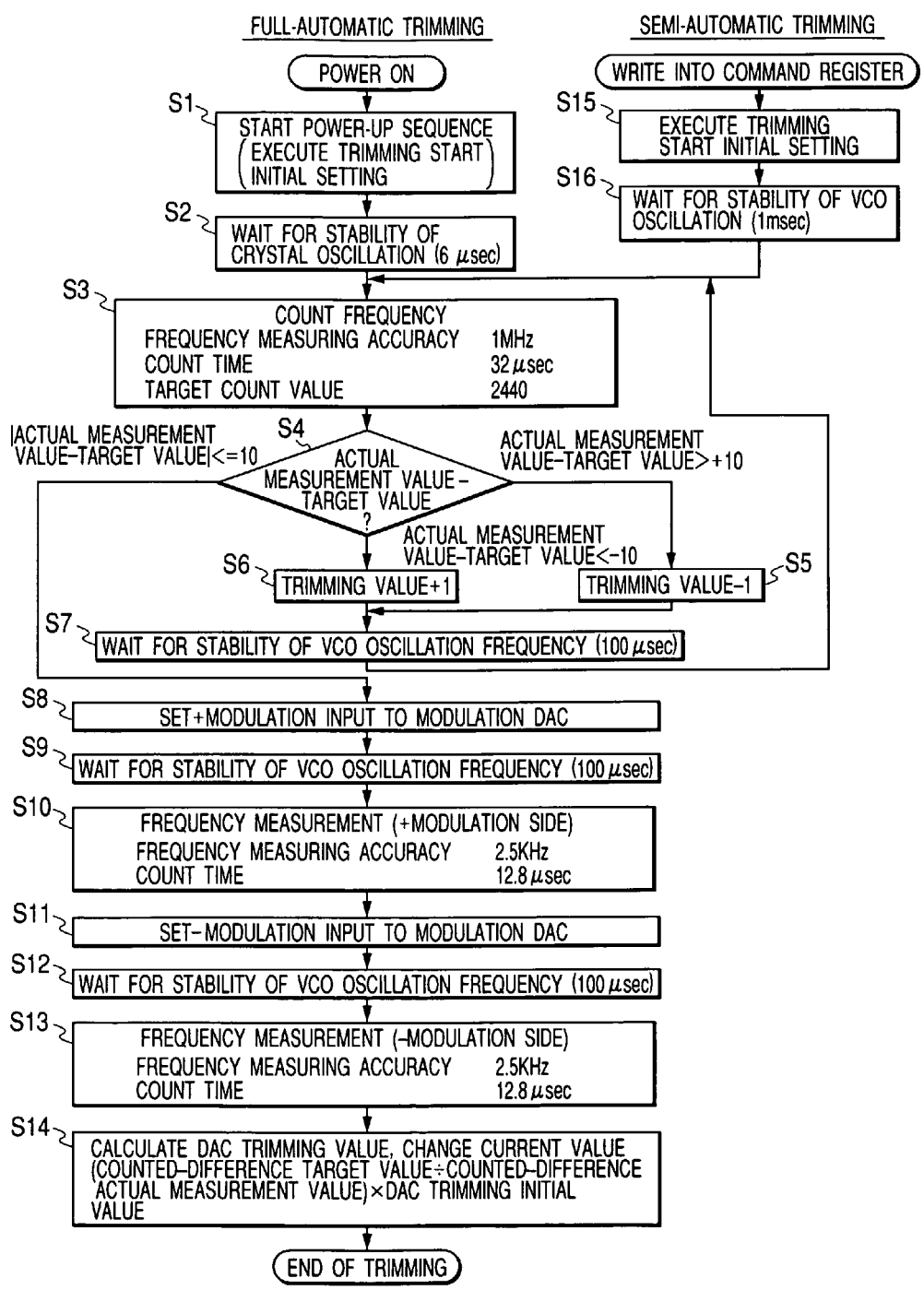
FIG. 9 is a flowchart illustrating one example of a procedure for adjusting a carrier frequency of the VCO and the amount of modulation-based frequency displacement thereof, using a frequency adjustment/control circuit of the embodiment.

A procedure for adjusting the carrier frequency of the VCO 134a employed in the transmission system circuit and the amount of frequency displacement thereof will next be described using a flowchart shown in FIG. 9. In the transmission system circuit according to the present embodiment, the sequencer 139 is configured in such a manner that the process of automatically adjusting the frequency in accordance with the flowchart of FIG. 9 is executed according to either power on or the input of a command. When power is turned on, the process is started from Step S1 on the left side of FIG. 9, whereas when a frequency adjustment execute command is inputted, the process is started from Step S15 on the right side of FIG. 9.

A full-automatic trimming process at the power-on will first be explained. A power-up sequence is started up with the power-on to perform an initial setting for an automatic adjustment (Step S1). Described specifically, the control signals CB1 through CB3 supplied from the arithmetic logic 138c to the capacitance value switching circuit 134b provided in the modulating oscillator circuit 134 are set to predetermined states to thereby on/off set the switches SW1 through SW3 such that the capacitance value switching circuit 134b assumes substantially the central capacitance value of its capacitance value variable range.

The sequencer 139 changes over the switch SWc on the PLL loop to the reference voltage Vref side and thereby causes the VCO 134a to perform an oscillating operation at a predetermined carrier frequency. The reference voltage Vref may be a voltage lying within a variable range of the control voltage V1. For instance, a voltage equivalent to substantially the center of the variable range of the control voltage V2 is selected. A count value (target value) corresponding to the frequency of the VCO 134a expected when the reference voltage Vref is applied as the control voltage V1, is set to the register 138c provided within the frequency adjustment/control circuit 138 in accordance with the value of the reference voltage Vref.

Further, the sequencer 139 sets a suitable value to the register REG of the DA converter circuit 132 to cause a predetermined current (e.g., a center current value in a current variable range) to flow into the current value switching circuit 132b of the DA converter circuit 132. Consequently, a control voltage V2 for the VCO 134a is set. Incidentally, as an alternative to the fixing of the control voltage V2 thereto rather than the setting thereof to the register REG, a selector switch similar to the switch SWc on the PLL loop may be provided on the modulation control side to supply a predetermined reference voltage in place of the control voltage V2 outputted from the low-pass filter 133.

Next, the sequencer 139 waits for the stability of an oscillating operation of the crystal oscillator 140 (Step S2). Then, the sequencer 139 gives an enable signal to the frequency adjustment/control circuit 138 to cause the counter 136 to count the oscillation output of the VCO 134a only for a predetermined time interval determined according to the cycle of a clock signal φb supplied from the divider 141 (Step S3). In the present embodiment, for example, the count time of the counter 138a is set to 32 μs and a target count value is set to "2440" so that 1 MHz is obtained as frequency accuracy. Further, the frequency of the clock signal φb, i.e., the division ratio of the divider 141 is also set in advance so as to enable the above.

Subsequently, the sequencer 139 causes the arithmetic logic 138b to compute the difference between the count value of the counter 138a and the target value pre-set to the register 138c and thereby determines to which degree the oscillation frequency of the VCO 134a is displaced or shifted from the target value (Step S4). When the difference between an actual measurement value counted by the counter 138a and the target value is greater than or equal to "+10", the sequencer 139 proceeds to Step S5, where a trimming value is decremented by 1.

Thus, the capacitance value is increased by one step in the capacitance value switching circuit 134b provided in the modulating oscillator circuit 134, and the oscillation frequency of the VCO 134a is reduced. On the other hand, the difference between the actual measurement value and the target value is less than or equal to "−10", the sequencer 139 proceeds to Step S6, where the trimming value is increased by 1. Thus, the capacitance value is reduced by one step in the capacitance value switching circuit 134b provided in the modulating oscillation circuit 134, and the oscillation frequency of the VCO 134a is increased. Then, the sequencer 139 waits for the stability of the oscillation frequency of the VCO 134a which has been changed due to the switching of capacitance. Thereafter, the sequencer 139 returns to Step S3 again, where the frequency is counted (Step S7).

When it is determined in Step S4 that the difference between the actual measurement value of the oscillation frequency of the VCO 134a and the target value falls between "−10" and "+10", the oscillation frequency of the VCO 134a falls within a target range and the trimming of the carrier frequency is regarded as completed. Thus, the sequencer 139 proceeds to Step S8 for the purpose of trimming of the amount of modulation-based frequency displacement. In Step S8, the sequencer 139 effects the setting (+side displacement) of inputting modulation control data used to activate the modulating DA converter circuit in the direction to increase the oscillation frequency fc of the VCO 134a by a predetermined frequency +Δf on the modulating DA converter circuit 132. At this time, the count time of the counter 138a and the division ratio of the divider 141 are also set.

Then, the sequencer 139 waits for the stability of the oscillating operation of the VCO 134a (Step S9). Thereafter, the sequencer 139 supplies an enable signal to the frequency adjustment/control circuit 138 to thereby allow the counter 136 to count the oscillation output of the VCO 134a only for a predetermined time interval determined according to the cycle of the clock signal φb supplied from the divider 141 (Step S10). In the present embodiment, the count time of the counter 138a is set to, for example, 12.8 μs such that 2.5 kHz is obtained as the accuracy of the amount of modulation-based frequency displacement. Further, the frequency of the clock signal φb, i.e., the division ratio of the divider 141 is also set so as to enable it. Incidentally, the count value of the counter 138a at Step S10 is retained in the register.

Subsequently, the sequencer 139 effects the setting (−side displacement) of inputting modulation control data used to activate the modulating DA converter circuit in the direction to decrease the oscillation frequency fc of the VCO 134a by a predetermined frequency −Δf on the modulating DA converter circuit 132 (Step S11). Then, the sequencer 139 waits for the stability of the oscillating operation of the VCO 134a (Step S12). Thereafter, the sequencer 139 causes the counter 136 to count the oscillation output of the VCO 134a by a predetermined time (Step S13).

Next, the sequencer 139 calculates the trimming value of the reference current of the DA converter 132a, using the following expression through the use of the arithmetic logic 138 on the basis of the count values obtained in Steps S10 and S13:

(target value÷actual measurement value)×DAC trimming initial value

The value of the register REG provided in the current value switching circuit 132b is rewritten based on the trimming value to change a current value (Step S14). Thus, trimming is completed.

Incidentally, the target value and actual measurement value in the expression at the present Step are respectively equivalent to a target value corresponding to the difference between a count value at the + side displacement of the counter 138a and a count value at the − side displacement, and an actual measurement value corresponding to the difference. Since the trimming value is determined by calculation at Step S14 in the present embodiment, the trimming of the amount of modulation-based frequency displacement can be terminated by one setting change.

In the present embodiment as described above, the same counter 138a and the common arithmetic logic 138b are used to automatically adjust a variation in the carrier frequency of the VCO 134a and a variation in the amount of modulation-based frequency displacement. Therefore, a circuit scale can be reduced as compared with the case in which discrete circuits are provided to make an adjustment to the variation in the carrier frequency and make an adjustment to the variation in the amount of modulation-based frequency displacement.

A description will next be made of an adjustment (semi-automatic trimming) made to the variation in the frequency of the modulating VCO 134a when the system is in operation.

The semi-automatic trimming process is started by writing of a predetermined command (called "frequency adjustment execution command") from the baseband circuit or the like to a command register provided in the sequencer 139. When the frequency adjustment execution command is inputted, the sequencer 139 performs an initial setting for an automatic adjustment (see Step S15 on the right side in FIG. 9). The initial setting is substantially identical to the setting performed in Step S1 upon power-on.

Thereafter, the sequencer 139 waits for the stability of the oscillation frequency of the VCO 134a at Step S16 and proceeds to Step S3 for measuring the frequency. Since the crystal oscillator 140 is already oscillated unlike upon power-on, an oscillation operation stability waiting or latency time (1 ms) of the VCO 134a may be shorter than a waiting or latency time (6 ms) at power-on. Since processing subsequent to the frequency measuring process of Step S3 is common to the above-described frequency adjusting process at power-on, the description thereof will be omitted.

In the present embodiment as described above, the variation in the frequency of the VCO 134a can be adjusted upon power-on and during operating of the system, respectively. Therefore, the present embodiment has the advantages that there is no need to perform frequency trimming in the manufacturing process and hence the manufacturing cost can be reduced, and the frequency can be corrected even when it is shifted due to a variation with time and temperature variations, thereby making it possible to perform high accuracy communication.

While the invention made above by the present inventors has been described specifically by the illustrated embodiment, the present invention is not limited to the embodiment. It is needless to say that various changes can be made thereto within the scope not departing from the gist thereof. Although the above embodiment has explained, for example, the case in which both the variation in the carrier frequency of the VCO and the variation in the amount of modulation-based frequency displacement can respectively be adjusted automatically, it is also possible to perform an adjustment to the variation in the carrier frequency by means of the trimming in the manufacturing process and automatically adjust only the variation in the amount of modulation-based frequency displacement of VCO, for example.

Although the above embodiment has explained the case in which the variation in the carrier frequency of VCO and the variation in the amount of modulation-based frequency displacement are automatically adjusted in a state in which the communication semiconductor integrated circuit with the VCO built therein has been incorporated into the system, it is also feasible to substitute the register REG for holding the signals CB1 through CBn used to control the switches lying in the current value switching circuit 132b employed in the embodiment and the register for holding the signals CB1 through CBn used to control the switches lying in the capacitance value switching circuit 134b, with a non-volatile memory or a fuse element, measure the frequency by use of the circuit of the embodiment in the manufacturing process and set values for correcting a variation in the frequency to the non-volatile memory or the fuse element.

Although the current value switching circuit 132b and the capacitance value switching circuit 134b are configured such that the current and capacitance values are respectively varied stepwise, they may be configured so that the respective values are continuously changed. Although the accuracy is degraded, a time-reduction mode may be provided which sets the measuring time of the oscillation output of the VCO by the counter 138a to half or the like and completes trimming of the frequency in a short period of time.

The sequencer (139) can also be configured of a counter and a decoder. Although the set value compared with the count value of the counter 138a is to be set to the externally settable register 138c in the embodiment referred to above, it may be fixed without using the register. However, the degree of freedom can be improved owing to the use of the externally settable register as in the embodiment.

While the above description has principally been made of the case in which the invention made by the present inventors is applied to the VCO employed in the wireless communication system like the bluetooth, which belongs to the field of application reaching the background of the invention, the present invention is not limited to it. The present invention can be widely used in a communication semiconductor integrated circuit with a VCO built therein, which is employed in a frequency modulation wireless communication system such as a cellular phone.

Advantageous effects obtained by typical ones of the inventions disclosed by the present application will be described in brief as follows:

According to the present invention, the amount of modulation-based frequency displacement can be corrected by a frequency adjustment/control circuit built in a communication semiconductor integrated circuit having a voltage-controlled oscillator circuit. Therefore, the amount of modulation-based frequency displacement of the voltage-controlled oscillator circuit can be adjusted in a state in which it has been packaged on a system. It is thus possible to correct a variation in the oscillation frequency of the voltage-controlled oscillator circuit without performing trimming in a manufacturing process and reduce the cost. A shift in frequency due to a change in operating environment can also be corrected and high accuracy communication can be performed.

According to the present invention as well, the frequency adjustment/control circuit is configured so as to be capable of generating a signal corresponding to the difference between a measurement value of the frequency of the voltage-controlled oscillator circuit and a target value and changing the value of each of capacitors constituting the voltage-controlled oscillator circuit in accordance with the signal, thereby adjusting even the carrier frequency of a carrier. Thus, both the carrier frequency of the oscillation signal of the voltage-controlled oscillator circuit and the amount of modulation-based frequency displacement can be corrected by the common frequency adjustment/control circuit, and an increase in circuit scale can be avoided.

What is claimed is:

1. A communication semiconductor integrated circuit, comprising:
   a DA converter circuit which DA-converts a modulating code;
   a voltage-controlled oscillator circuit;
   a phase comparator which detects a phase difference between an oscillation output of the voltage-controlled oscillator circuit and a reference clock signal; and
   a control voltage generating circuit which generates a voltage corresponding to the phase difference detected by the phase comparator and applies the voltage to the voltage-controlled oscillator circuit as a first control voltage,
   said voltage-controlled oscillator circuit being controlled by the first control voltage to thereby generate a frequency signal used as a carrier, and the voltage-controlled oscillator circuit being controlled by a second control voltage based on an output of the DA converter circuit to thereby frequency-modulate the carrier and output a modulated carrier,
   a frequency adjustment/control circuit which measures the frequency of the oscillation output of the voltage-controlled oscillator circuit and generates a signal corresponding to the measured value by referring to a pre-set target value,
   wherein a reference current value of the DA converter circuit is changed based on the signal generated by the frequency adjustment/control circuit to thereby correct a frequency of the oscillation output of the voltage-controlled oscillator circuit, and
   wherein the frequency adjustment/control circuit includes: a frecquency measuring circuit which measures the oscillation output of the voltage-controlled oscillator circuit or a frequency of a signal obtained by dividing the oscillation output; and an arithmetic circuit which calculates a correction value from the value measured by the frequency measuring circuit and the target value.

2. A communication semiconductor integrated circuit according to claim 1, wherein the frequency adjustment/control circuit measures the frequency of the oscillation output of the voltage-controlled oscillator circuit according to turning on of a power supply voltage and generates a signal corresponding to the measured value.

3. A communication semiconductor integrated circuit according to claim 1, wherein the frequency adjustment/control circuit measures the frequency of the oscillation output of the voltage-controlled oscillator circuit according to an input of a predetermined command and generates a signal corresponding to the measured value.

4. A communication semiconductor integrated circuit according to claim 1, wherein the DA converter circuit includes: a current value switching circuit which varies the reference current value on the basis of the correction value; and a register which holds the correction value.

5. A communication semiconductor integrated circuit according to claim 1, wherein the arithmetic circuit generates a difference between a value measured by the frequency measuring circuit in a state controlled so as to increase the frequency of the oscillation output of the voltage-controlled oscillator circuit in accordance with an output from the DA converter circuit and a value measured by the frequency measuring circuit in a state controlled so as to decrease the frequency of the oscillation output of the voltage-controlled oscillator circuit in accordance with an output from the DA converter circuit, generates a signal corresponding to a ratio of the difference to the pre-set target value; and supplies the signal and the difference to the current value switching circuit as a current value control signal.

6. A communication semiconductor integrated circuit according to claim 1, wherein the arithmetic circuit is configured so as to generate a signal corresponding to the difference between the value measured by the frequency measuring circuit and the pre-set target value, and correct the frequency of the carrier of the voltage-controlled oscillator circuit in accordance with the signal corresponding to the difference.

7. A communication semiconductor integrated circuit according to claim 1, wherein the voltage-controlled oscillator circuit comprises an LC resonant oscillator, and changes values of capacitances constituting the LC resonant oscillator to thereby vary the oscillation frequency.

8. A communication semiconductor integrated circuit according to claim 7, wherein the voltage-controlled oscillator circuit includes a capacitance value switching circuit comprising a plurality of capacitive elements and switch elements coupled in series with the respective capacitive elements, and selects the turned-on one of the switch elements to thereby vary an oscillation frequency.

9. A communication semiconductor integrated circuit according to claim 1, wherein the voltage-controlled oscillator circuit includes first variable capacitance function and second variable capacitance function, and is configured such that a capacitance value of the first variable capacitance function is varied by the first control voltage and a capacitance value of the second variable capacitance function is varied by the second control voltage to thereby change oscillation frequencies independently respectively.

10. A communication semiconductor integrated circuit, comprising:
- a DA converter circuit which DA-converts a modulating code;
- a voltage-controlled oscillator circuit;
- a phase comparator which detects a phase difference between an oscillation output of the voltage-controlled oscillator circuit and a reference clock signal; and
- a control voltage generating circuit which generates a voltage corresponding to the phase difference detected by the phase comparator and applies the voltage to the voltage-controlled oscillator circuit as a first control voltage,
- said voltage-controlled oscillator circuit being controlled by the first control voltage to thereby generate a frequency signal used as a carrier, and the voltage-controlled oscillator circuit being controlled by a second control voltage based on an output of the DA converter circuit to thereby frequency-modulate the carrier and output a modulated carrier,
- a frequency adjustment/control circuit which measures the frequency of the oscillation output of the voltage-controlled oscillator circuit and generates a signal corresponding to the measured value by referring to a pre-set target value,
- wherein the characteristic of the DA converter circuit is changed based on the signal generated by the frequency adjustment/control circuit to thereby correct a frequency of the oscillation output of the voltage-controlled oscillator circuit, and
- wherein the frequency adjustment/control circuit includes: a frequency measuring circuit which measures the oscillation output of the voltage-controlled oscillator circuit or a frequency of a signal obtained by dividing the oscillation output; and an arithmetic circuit which calculates a correction value from the value measured by the frequency measuring circuit and the target value.

* * * * *